United States Patent
Fujimoto et al.

(10) Patent No.: US 6,717,186 B2
(45) Date of Patent: Apr. 6, 2004

(54) SEMICONDUCTOR LASER DEVICE

(75) Inventors: Tsuyoshi Fujimoto, Sodegaura (JP); Kiyofumi Muro, Ichihara (JP); Takeshi Koiso, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 32 days.

(21) Appl. No.: 10/230,988

(22) Filed: Aug. 30, 2002

(65) Prior Publication Data

US 2003/0052315 A1 Mar. 20, 2003

(51) Int. Cl.[7] .............................................. H01L 33/00
(52) U.S. Cl. .......................................... 257/98; 372/46
(58) Field of Search ............................... 372/46; 257/98

(56) References Cited

U.S. PATENT DOCUMENTS

| | | | |
|---|---|---|---|
| 5,920,767 A | * | 7/1999 | Horie et al. ................. 438/40 |
| 6,171,878 B1 | | 1/2001 | Fujimoto et al. |
| 6,597,717 B1 | * | 7/2003 | Kneissl et al. ................ 372/46 |

FOREIGN PATENT DOCUMENTS

| | | |
|---|---|---|
| EP | 0 843 393 A | 5/1998 |
| EP | 0 903 821 A | 3/1999 |
| EP | 1 033 796 A | 9/2000 |
| EP | 1 104 057 A | 5/2001 |
| GB | 2 323 708 A | 9/1998 |
| JP | 08 204285 A | 8/1996 |
| JP | 11-154775 A | 6/1999 |

OTHER PUBLICATIONS

Ryuji Kobayashi et al., "Real Index–guided AIGainP Visible Laser with High–Bandgap Energy AlInp Current Blocking Layer Grown by HCl–Assisted Metalorganic Vapor Phase Epitaxy", IEEE Journal of Selected Topics in Quantum Electronics, IEEE Service Center, U.S. vol. 1., No. 2, Jun. 1, 1995, pp. 723–727, XP000–521130, ISSN: 1077–260X.

Yoshikazu Yamada et al., "Characteristics and reliablity of high–power inGaAs/AIGaAs laser diodes with decoupled confinement heterostructure", PROCEEDINGS OF THE SPIE, SPIE, Bellingham, Va, US. vol. 3626, Jan. 26, 1999, pp. 231–239. XP000997831.

* cited by examiner

*Primary Examiner*—Douglas A. Wille
(74) *Attorney, Agent, or Firm*—Burns, Doane, Swecker & Mathis, LLP

(57) ABSTRACT

A real index guided semiconductor laser device includes an optical waveguide layer at least on one side of an active layer that has a band gap energy not less than that of the active layer; a cladding layer on an outer side of the optical waveguide layer that has a band gap energy not less than that of the optical waveguide layer; a refractive index control layer having a striped window, buried in the optical waveguide layer by selective growth; and a semiconductor layer formed in the optical waveguide layer by selective growth prior to the selective growth of the refractive index control layer. In a laminated portion including the semiconductor layer and the refractive index control layer, a change in effective refractive index due to a change in thickness of the semiconductor layer is smaller than that of the refractive index control layer.

4 Claims, 3 Drawing Sheets

SEMICONDUCTOR LASER DEVICE

BACKGROUND OF THE INVENTION

1. Field of the Invention

The present invention relates to a real index guided semiconductor laser device capable of high power operation that can be used preferably in communications, laser printers, laser medical treatment, laser processing and the like.

2. Description of the Related Art

FIGS. 4A to 4C are cross-sectional views showing the structure of a real index guided semiconductor laser device (hereinafter, referred to as "DCH-SAS type LD") having a decoupled confinement heterostructure as shown in Japanese Unexamined Patent Publication JP-A 11-154775 (1999) and a method for manufacturing the same.

In FIG. 4A, an n-type AlGaAs cladding layer 2, an n-type AlGaAs optical waveguide layer 3, an n-type AlGaAs carrier blocking layer 4, GaAs/AlGaAs quantum well active layer 5, a p-type AlGaAs carrier blocking layer 6, a part of a p-type AlGaAs optical waveguide layer 7 are formed in this order by crystal growth on an n-type GaAs substrate 1. Then, as shown in FIG. 4B, an $SiO_2$ stripe mask 8 is formed on the grown epitaxial substrate, more specifically, on a predetermined region on the p-type AlGaAs optical waveguide layer 7a by evaporation and photolithography techniques. Then, as shown in FIG. 4B, an n-type AlGaAs refractive index control layer 9 is formed by selective growth on the region other than the region where the $SiO_2$ stripe mask 8 is formed. Then, after the $SiO_2$ stripe mask 8 is removed, as shown in FIG. 4C, a p-type AlGaAs optical waveguide layer 7b that is the rest of the optical waveguide layer, a p-type AlGaAs cladding layer 10, and a p-type HGaAs contact layer 11 are formed in this order by crystal growth. Thus, a DCH-SAS type LD is manufactured. The p-type AlGaAs optical waveguide layer 7a and the p-type AlGaAs optical waveguide layer 7b constitute one optical waveguide layer 7.

In such a DCH-SAS type LD, a semiconductor material having a lower refractive index than that of the optical waveguide layer 7 is buried as the refractive index control layer 9. This creates an effective refractive index difference also in the direction parallel to the active layer 5 in a striped region R1 (which may be referred to as a "window" in the following) in which the refractive index control layer 9 is not formed in the optical waveguide layer 7 (the direction parallel to the active layer 5 is the width direction of a striped window R1). Thus, laser light is confined also in the width direction of the striped window R1, so that single transverse mode oscillation can be obtained highly efficiently at a low threshold.

Furthermore, in the production method employing selective growth as shown in FIGS. 4A to 4C, an etching process in which processing precision is low is eliminated, and the refractive index control layer 9 can be formed utilizing the high control properties of the crystal growth method such as MOCVD, MOMBE, and MBE.

In general, the crystal growth technique has high control properties. However, immediately after the start of growth on a substrate that has been exposed to air, growth is specifically unstable. For example, immediately after growth starts, the growth rate is reduced, or in the worst case, an idle running time during which no growth is caused occurs. In the method for manufacturing a semiconductor laser device employing selective growth as described above, the refractive index control layer 9 is grown directly on the epitaxial substrate that has been exposed to air. Therefore, the thickness of the refractive index control layer 9 is unstable due to the occurrence of the idle running time or the like. This causes the problem that the reproducibility of the effective refractive index difference in the width direction of the striped window R1 is not good. In particular, when the refractive index control layer 9 is designed to be thin, this problem is more serious.

SUMMARY OF THE INVENTION

It is an object of the invention to provide a semiconductor laser device comprising a refractive index control layer which can be formed by selective growth under highly controlling the thickness thereof, and having an effective refractive index difference of good reproducibility, and a high production yield.

The present invention provides a real index guided semiconductor laser device comprising:

an active layer;

an optical waveguide layer provided at least on one side of the active layer, the optical waveguide layer having a band gap energy equal to or more than a band gap energy of the active layer;

a cladding layer provided on an outer side of the optical waveguide layer, the cladding layer having a band gap energy equal to or more than the band gap energy of the optical waveguide layer;

a refractive index control layer having a striped window, buried in the optical waveguide layer or buried between the optical waveguide layer and the cladding layer, the refractive index control layer being formed by selective growth; and a semiconductor layer being formed by selective growth prior to the formation of the refractive index control layer by the selective growth, wherein a material of the semiconductor layer is selected so that, in a laminated portion including the semiconductor layer and the refractive index control layer, a change in effective refractive index due to a change in thickness of the semiconductor layer is smaller than a change in effective refractive index due to a change in thickness of the refractive index control layer.

According to the invention, the semiconductor layer is selectively grown prior to the refractive index control layer. Therefore, the selective growth is stabilized during the growth of the semiconductor layer, the refractive index control layer can be formed by selective growth under highly controlling the thickness of the refractive index control layer. In the laminated portion including the semiconductor layer and the refractive index control layer, the change in effective refractive index due to a change in thickness of the semiconductor layer is smaller than that of the refractive index control layer. Therefore, even if the thickness of the semiconductor layer is reduced due to an occurrence of idle running time or the like, the influence on the effective refractive index in the laminated portion can be suppressed to be smaller than in the case where the semiconductor layer is not used. Consequently, the variation of the difference in effective refractive index between two laminated portions including the semiconductor layer and the refractive index control layer, and a laminated portion including a window sandwiched between the two laminated portions becomes smaller among semiconductor laser devices.

Thus, the refractive index control layer of the semiconductor laser device can be formed by selective growth under highly controlling the thickness thereof, and a desired effective refractive index difference, which is a difference in effective refractive index between the laminated portions including the semiconductor layer and the refractive index control layer, and a laminated portion including the window of the refractive index control layer, can be created with high reproducibility, with the result that an improved production yield can be realized.

In the invention, it is preferable that a change in effective refractive index difference due to a change in thickness of the semiconductor layer is $5\times10^{-6}$/nm or less, wherein the effective refractive index difference is a difference in effective refractive index between the laminated portions including the semiconductor layer and the refractive index control layer, and a laminated portion including the window of the refractive index control layer.

According to the invention, the effect of reducing the effective refractive index due to the formation of the semiconductor layer having a low refractive index in the optical waveguide layer is substantially offset by the effect of increasing the effective refractive index due to an increase of the entire thickness of the optical waveguide layer. The crystal growth is stabilized with growth corresponding to 10 nm to 50 nm. Therefore, if the change in effective refractive index due to a change in thickness of the semiconductor layer is designed to be $5\times10^{-6}$/nm or less, the effective refractive index difference is controlled by the refractive index control layer formed to have a desired thickness, substantially without being affected by the thickness of the semiconductor layer. Consequently, the refractive index control layer of the semiconductor laser device can be formed by selective growth under highly controlling the thickness thereof, and a desired effective refractive index difference, which is a difference in effective refractive index between the laminated portions including the semiconductor layer and the refractive index control layer, and a laminated portion including the window of the refractive index control layer, can be created with high reproducibility, with the result that an improved production yield can be realized.

In the invention, it is preferable that a thickness of the refractive index control layer is 300 nm or less in terms of further effectiveness.

According to the invention, even if a refractive index control layer is formed to be thin and an occurrence of idle running time or the like affects the effective refractive index difference significantly, a desired thickness thereof can be reproduced precisely. Therefore, the ability of controlling the thickness of the refractive index control layer formed by selective growth can be increased, a desired effective refractive index difference can be created with good reproducibility, and the production yield can be improved.

According to the invention, it is possible to control the effective refractive index difference in the width direction of the window with good reproducibility by stabilizing crystal growth during growth of the semiconductor layer whose influence on the effective refractive index is suppressed to be small to improve the ability of controlling the thickness of the subsequently grown refractive index control layer.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
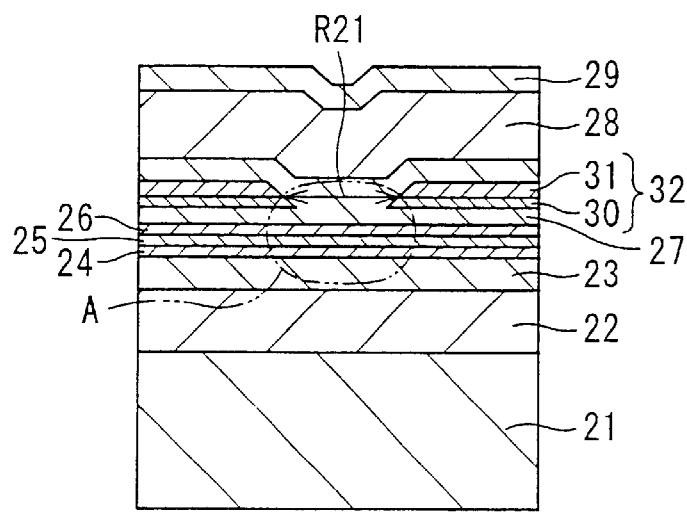
FIG. 1 is a cross-sectional view showing the structure of a semiconductor laser device, which is an embodiment of the invention.

Now referring to the drawings, preferred embodiments of the invention are described below.

FIG. 1 is a cross-sectional view showing the structure of a semiconductor laser device as one embodiment of the invention. In this embodiment, a DCH-SAS type laser device is taken as an example to describe the invention. In the semiconductor laser device, an n-type $Al_{0.09}Ga_{0.91}As$ cladding layer 22, an n-type GaAs optical waveguide layer 23, an n-type $Al_{0.40}Ga_{0.60}As$ carrier blocking layer 24, an $In_{0.18}Ga_{0.82}As$/GaAs quantum well active layer 25, a p-type $Al_{0.40}Ga_{0.60}As$ carrier blocking layer 26, a p-type GaAs optical waveguide layer 27, a p-type $Al_{0.09}Ga_{0.91}As$ cladding layer 28, and a p-type GaAs contact layer 29 are laminated in this order on an n-type GaAs substrate 21.

In the vertical direction, light is sandwiched by the upper and lower cladding layers 22 and 28 having refractive indexes smaller than those of the active layer 25 and the optical waveguide layers 23 and 27. In the lateral direction (horizontal direction in the sheet surface of FIG. 1), light is confined to a region (hereinafter, referred to as "window") R21 extending in a striped shape in the resonant direction sandwiched by the refractive index control layer 31 having refractive index smaller than that of the optical waveguide layer 27.

In this embodiment, "creating a difference in the effective refractive index" means creating a difference between the effective refractive index in a waveguide portion of the semiconductor laser device (roughly a portion surrounded by a two-dot chain line A in FIG. 1) and the effective refractive index of the two laminated portions positioned on both sides (the right and left sides in FIG. 1) of the waveguide portion.

The feature of the invention lies in that the semiconductor layer 30 is provided below the refractive index control layer 31, and the semiconductor layer 30 is made of a material (or has a composition) that prevents the effective refractive index in the laminated portions including the semiconductor layer 30 from being varied even if the thickness of the semiconductor layer 30 is varied among semiconductor laser devices. The inventors of the present invention found out that there exists the semiconductor layer 30 that prevents the effective refractive index in the laminate 32 from being varied, even if the thickness is varied because the refractive index control layer 31 is epitaxially grown after being exposed to air so that it is difficult to control the thickness in the early stage of growth. In the present invention, the semiconductor layer 30 is formed by epitaxial growth in an early stage prior to the refractive index control layer 31 to stabilize the effective refractive index in the laminated portions including semiconductor layer 30.

Furthermore, the laminate 32 obtained by laminating an n-type $Al_{0.09}Ga_{0.91}As$ refractive index control layer 31 on the n-type $Al_{0.06}Ga_{0.94}As$ semiconductor layer 30 is provided in the p-type GaAs optical waveguide layer 27. This laminate 32 has a striped region R21. The striped region is a region in which the semiconductor layer 30 and the refractive index control layer 31 are not provided.

Figure 2:
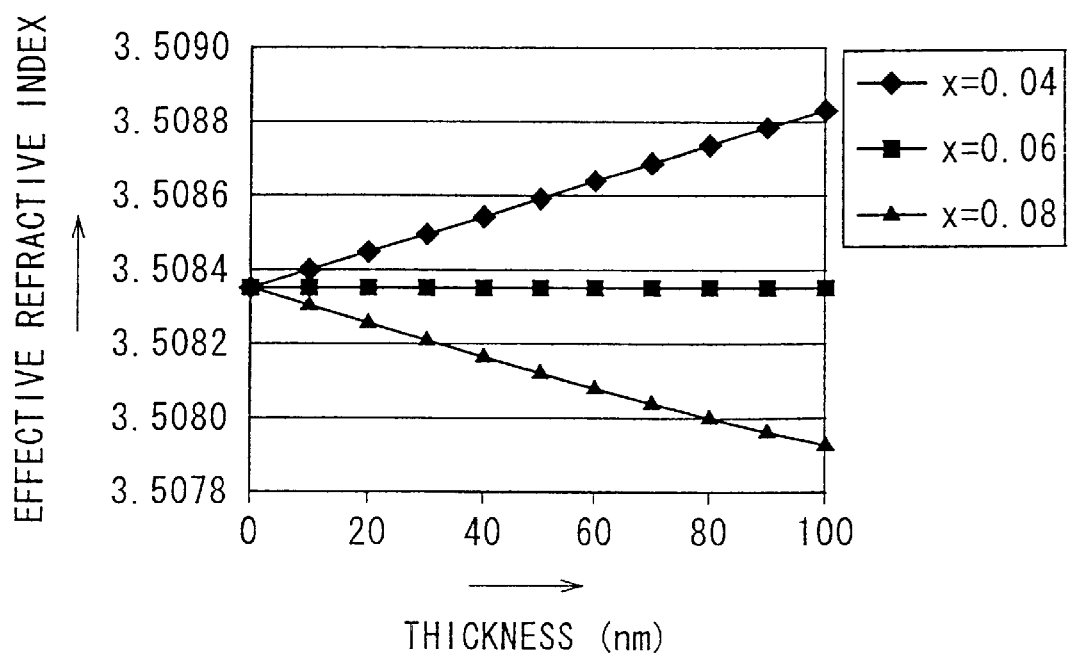
FIG. 2 is a graph showing the relationship between the thickness of a semiconductor layer 30 and the effective refractive index when Al composition (X) of the semiconductor layer 30 made of $Al_xGa_{1-x}As$ is changed in the laminated structure of the semiconductor laser device shown in FIG. 1.

FIG. 2 is a graph showing the relationship between the thickness of the semiconductor layer 30 and the effective refractive index when the Al composition (X) of the semiconductor layer 30 made of $Al_xGa_{1-x}As$ is changed in the laminated structure of the semiconductor laser device shown in FIG. 1. FIG. 2 indicates that when X is 0.06 in the Al composition, the effective refractive index is constant even if the thickness of the semiconductor layer 30 is changed.

Thus, when the laminated structure of the semiconductor laser device is determined, the composition of the semiconductor layer can be optimized by performing simulations of the composition (refractive index) of the semiconductor layer provided in the optical waveguide layer according to the determined laminated structure and the effective refractive index while the thickness is varied. The effective refractive index can be obtained, for example, with BPM#CAD (manufactured by Optiwave Corporation).

In this embodiment, the semiconductor layer 30 is used by which the effect of reducing the effective refractive index due to the formation of the semiconductor layer 30 having a refractive index lower than that of the optical waveguide layer 27 in the optical waveguide layer 27 is offset by the effect of increasing the effective refractive index due to an increase of the entire thickness of the optical waveguide layer 27. Therefore, even if the thickness of the semiconductor layer 30 is changed, as shown in FIG. 2, the effective refractive index outside the window R21 can be constant. Consequently, the effective refractive index difference in the width direction of the striped region R21 can be constant, regardless of the thickness of the semiconductor layer 30.

Figure 3A:
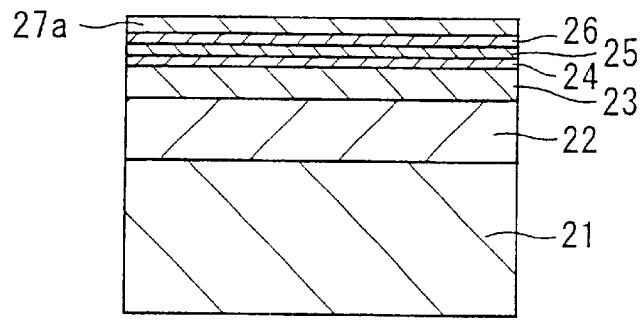
FIGS. 3A to 3C are cross-sectional views showing a method for manufacturing the semiconductor laser device shown in FIG. 1.
Figure 3B:
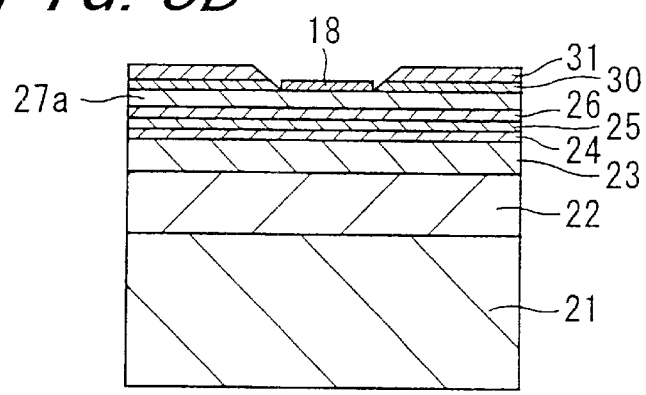
Figure 3C:
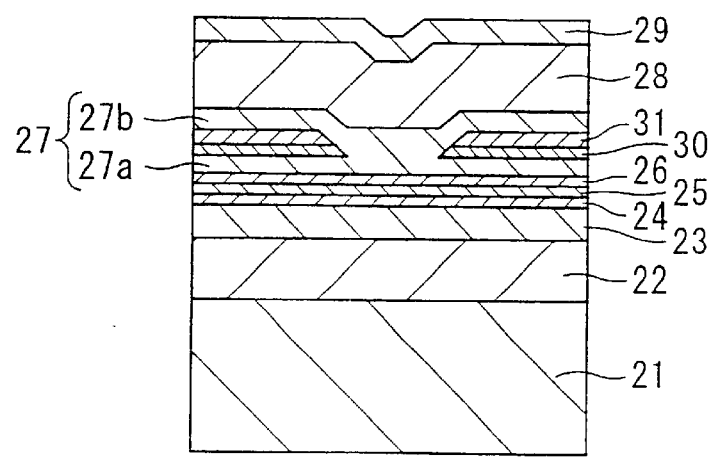
Figure 4A:
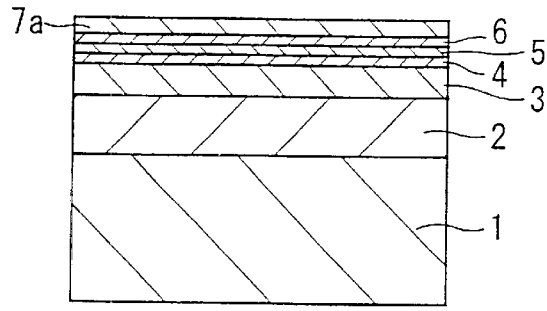
FIGS. 4A to 4C are cross-sectional views for illustrating prior art.
Figure 4B:
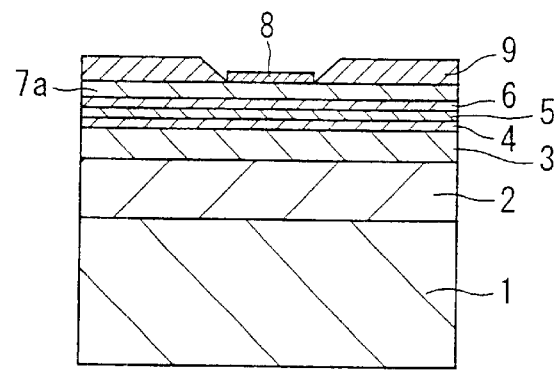
Figure 4C:
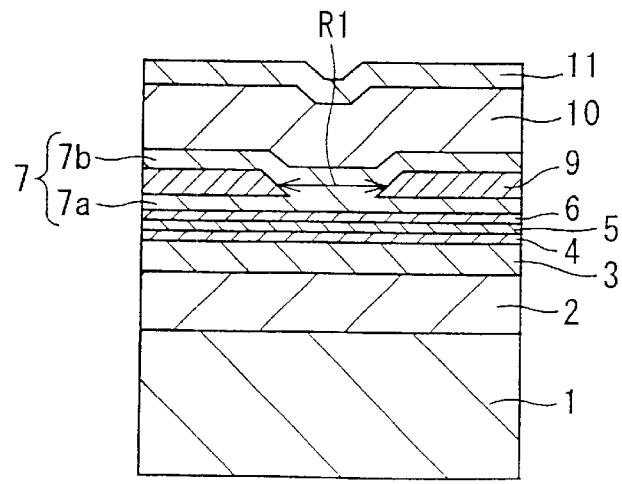

FIGS. 3A to 3C are cross-sectional views showing a method for manufacturing a laser device shown in FIG. 1. First, as shown in FIG. 3A, a 2.6 μm cladding layer 22 made of n-type $Al_{0.09}Ga_{0.91}As$, a 0.48 μm optical waveguide layer 23 made of n-type GaAs, a 0.03 μm carrier blocking layer 24 made of n-type $Al_{0.40}Ga_{0.60}As$, a quantum well active layer 25 made of $In_{0.18}Ga_{0.82}As$/GaAs, a 0.03 μm carrier blocking layer 26 made of p-type $Al_{0.40}Ga_{0.60}As$, and a part of an optical waveguide layer 27a made of p-type GaAs are crystal-grown in this order on an n-type GaAs substrate 21 by MOCVD or the like.

In AlGaAs materials, the band gap energy tends to increase as the Al composition increases. In this embodiment, the band gap energy of the optical waveguide layers 23 and 27 is larger than that of the quantum well active layer 25, and the band gap energy of each of the cladding layers 22 and 28 and the carrier blocking layers 24 and 26 is larger than that of the optical waveguide layers 23 and 27.

The thus crystal-grown substrate is removed out from a crystal growth apparatus, and placed in, for example, en electron beam evaporation apparatus. As shown in FIG. 3B, a striped mask is formed by forming a 0.1 μm mask 18 made of, for example, $SiO_2$ on the entire surface, and then removing the mask in a portion other than the central region that will serve as a striped window by a photolithography technique. This mask 18 is very thin, so that a conventional photolithography can be used for formation with a good reproducibility at a high precision.

Then, the substrate provided with the mask 18 is returned to the crystal growth apparatus, and an operation is performed for selective growth of a 0.01 μm semiconductor layer 30 made of n-type $Al_{0.06}Ga_{0.94}As$ and a 0.08 μm refractive index control layer 31 made of n-type $Al_{0.09}Ga_{0.91}As$ on a portion 27a of the optical waveguide layer 27. Then, a layer structure in which crystal growth is not caused in a region provided with the mask 18 can be obtained, as shown in FIG. 3B.

Then, the mask 18 is removed, for example, with a hydrofluoric acid aqueous solution. Then, as shown in FIG. 3C, a portion 27b that is the rest of the optical waveguide layer 27 is crystal-grown, and thus the optical waveguide layer 27 having a thickness of 0.48 μm made of p-type GaAs is formed. Furthermore, a 0.83 μm cladding layer 28 made of p-type $Al_{0.09}Ga_{0.91}As$, and a 0.3 μm contact layer 29 made of p-type GaAs are crystal-grown in this order.

In this manner, after the mask 18 is formed in the portion that will serve as the striped window R21, the laminate 32 including the semiconductor layer 30 and the refractive index control layer 31 is formed by selective growth. Thereafter, the mask 18 is removed. This method makes it possible to control the size in the height direction and the width direction of the window R21 sandwiched by the laminate 32 including the semiconductor layer 30 and the refractive index control layer 31 with a good reproducibility at a high precision. This selective growth of the laminate 32 including the semiconductor layer 30 and the refractive index control layer 31 makes it possible to produce a semiconductor laser device having an excellent oscillation threshold and stability in the transverse mode in a high yield.

The material of the mask 18 is not limited to $SiO_2$, and any material that allows selective growth such as SiN can be used.

As described heretofore, according to the embodiment, the semiconductor layer 30 is selectively grown prior to the refractive index control layer 31. Therefore, the ability of controlling the thickness of the refractive index control layer 31 grown subsequently to the growth stabilized during the growth of the semiconductor layer 30 can be enhanced. In the laminated portion including the semiconductor layer 30 and the refractive index control layer 31, the change in the effective refractive index due to a change in thickness of the semiconductor layer 30 is smaller than that of the effective refractive index due to a change in thickness of the refractive index control layer 31. Therefore, even if the thickness of the semiconductor layer 30 is reduced due to the occurrence of the idle running time or the like, the influence on the effective refractive index in the laminated portion can be suppressed to be smaller than in the case where the semiconductor layer 30 is not used. Consequently, the variation of the difference in effective refractive index between two laminated portions including the semiconductor layer 30 and the refractive index control layer 31, and the laminated portion including the window R21 sandwiched by the two laminated portions becomes smaller among semiconductor laser devices.

Thus, a semiconductor laser device having high ability of controlling the thickness of the refractive index control layer 31 formed by selective growth, a good reproducibility of the effective refractive index difference, and an improved production yield can be realized.

When the difference in effective refractive index between the laminated portion including the semiconductor layer 30 and the refractive index control layer 31, and the laminated portion including the window of the refractive index control layer 31 is defined as the effective refractive index difference, it is preferable that the change in the effective refractive index difference due to a change in thickness of the semiconductor layer 30 is $5\times10^{-6}$/nm or less.

In the semiconductor laser device described above, the effect of reducing the effective refractive index due to the formation of the semiconductor layer 30 having a low refractive index in the optical waveguide layer 27 is substantially offset by the effect of increasing the effective refractive index due to an increase of the entire thickness of the optical waveguide layer 27. The crystal growth is stabilized with growth corresponding to 10 nm to 50 nm. Therefore, if the change in the effective refractive index due to a change in thickness of the semiconductor layer 30 is designed to be $5\times10^{-6}$/nm or less, the effective refractive index difference is controlled by the refractive index control layer 31 formed to a desired thickness, substantially without being affected by the thickness of the semiconductor layer 30. Consequently, a semiconductor laser device having high thickness control properties of the refractive index control layer 31 formed by selective growth, a good reproducibility of the effective refractive index difference, and an improved production yield can be realized.

It is preferable that the thickness of the refractive index control layer 31 is 300 nm or less in terms of further effectiveness.

By forming the refractive index control layer 31 to be thin in that way, even if an occurrence of idle running time or the like affects the effective refractive index difference significantly, the thickness thereof can be reproduced precisely. Therefore, the ability of controlling the thickness of the refractive index control layer 31 formed by selective growth can be enhanced, the effective refractive index difference can be created with good reproducibility, and the production yield can be improved.

In this embodiment, the carrier blocking layers 24 and 26 are used, but without the carrier blocking layers 24 and 26, the effective refractive index of the window R21 can be constant by suitably determining the composition (refractive index) of the semiconductor layer 30, even if the thickness of the semiconductor layer 30 is changed. Besides, although, in this embodiment, the semiconductor layer 30 and the refractive index control layer 31 are formed within the optical waveguide layer 27, they may alternatively be formed between the optical waveguide layer 27 and the cladding layer 28.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A real index guided semiconductor laser device comprising:

an active layer;

an optical waveguide layer provided at least on one side of the active layer, the optical waveguide layer having a band gap energy equal to or more than a band gap energy of the active layer;

a cladding layer provided on an outer side of the optical waveguide layer, the cladding layer having a band gap energy equal to or more than the band gap energy of the optical waveguide layer;

a refractive index control layer having a striped window, buried in the optical waveguide layer or buried between the optical waveguide layer and the cladding layer, the refractive index control layer being formed by selective growth; and a semiconductor layer being formed by selective growth prior to the formation of the refractive index control layer by the selective growth, wherein a material of the semiconductor layer is selected so that, in a laminated portion including the semiconductor layer and the refractive index control layer, a change in effective refractive index due to a change in thickness of the semiconductor layer is smaller than a change in effective refractive index due to a change in thickness of the refractive index control layer.

2. The real index guided semiconductor laser device of claim 1, wherein a change in effective refractive index difference due to a change in thickness of the semiconductor layer is $5\times10^{-6}$/nm or less, wherein the effective refractive index difference is a difference in effective refractive index between the laminated portion including the semiconductor layer and the refractive index control layer, and a laminated portion including the window of the refractive index control layer.

3. The real index guided semiconductor laser device of claim 1, wherein a thickness of the refractive index control layer is 300 nm or less.

4. The real index guided semiconductor laser device of claim 2, wherein a thickness of the refractive index control layer is 300 nm or less.

* * * * *

UNITED STATES PATENT AND TRADEMARK OFFICE
CERTIFICATE OF CORRECTION

PATENT NO. : 6,717,186 B2
DATED : April 6, 2004
INVENTOR(S) : Tsuyoshi Fujimoto et al.

It is certified that error appears in the above-identified patent and that said Letters Patent is hereby corrected as shown below:

<u>Title page,</u>
Insert the following:

-- [30]     Foreign Application Priority Data

Aug. 31, 2001     (JP) ……………………….. 2001-262663 --

Signed and Sealed this

Twenty-sixth Day of October, 2004

JON W. DUDAS
*Director of the United States Patent and Trademark Office*